United States Patent
Kehl et al.

(10) Patent No.: US 8,698,506 B2
(45) Date of Patent: Apr. 15, 2014

(54) CIRCUIT CONFIGURATION FOR DETECTING AN ERROR IN A CONVERTER

(75) Inventors: Natalja Kehl, Obersulm (DE); Frank Freund, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 407 days.

(21) Appl. No.: 13/150,869

(22) Filed: Jun. 1, 2011

(65) Prior Publication Data

US 2011/0298471 A1 Dec. 8, 2011

(30) Foreign Application Priority Data

Jun. 4, 2010 (DE) .......................... 10 2010 029 693

(51) Int. Cl.
*G01R 31/02* (2006.01)
*H03M 1/06* (2006.01)

(52) U.S. Cl.
CPC ................... *H03M 1/0604* (2013.01)
USPC ........................................................ 324/537

(58) Field of Classification Search
None
See application file for complete search history.

(56) References Cited

U.S. PATENT DOCUMENTS

| | | | | |
|---|---|---|---|---|
| 4,535,319 A * | 8/1985 | Penney | ..................... | 341/156 |
| 5,059,896 A * | 10/1991 | Germer et al. | ................ | 324/142 |
| 5,583,502 A | 12/1996 | Takeuchi et al. | | |
| 5,748,124 A * | 5/1998 | Rosenthal et al. | ............ | 341/120 |
| 8,471,738 B2 * | 6/2013 | Kehl | ............................. | 341/120 |
| 2008/0186741 A1 * | 8/2008 | Rabo | .............................. | 363/13 |

OTHER PUBLICATIONS

"Test Generation and Concurrent Error Detection in Current-Mode A/D Converters" IEEE 1995, pp. 1291-1298, by Wey, Chin-Long, Shoba Krishnan and Sondes Sahli.
"A Proposal for Error Tolerating Codes" IEEE 1993, pp. 130-136, by Matsubara, Takashi and Yoshiaki Koga.

\* cited by examiner

*Primary Examiner* — Paresh Patel
(74) *Attorney, Agent, or Firm* — Kenyon & Kenyon LLP (57) ABSTRACT

A circuit configuration for detecting an error occurring in a converter, that is designed for integrating an analog useful signal and a digital useful signal of the converter and checking in each instance, when the integrated analog useful signal reaches a specific threshold value, and when the integrated digital useful signal reaches a specific threshold value, the circuit configuration for the converter detecting an error if the threshold values are not reached within a defined time window.

18 Claims, 6 Drawing Sheets

CIRCUIT CONFIGURATION FOR DETECTING AN ERROR IN A CONVERTER

CROSS REFERENCE

The present application claims the benefit under 35 U.S.C. §119 of German Patent Application No. 102010029693.7, filed on Jun. 4, 2010, which is expressly incorporated herein by reference in its entirety.

FIELD OF THE INVENTION

The present invention relates to a circuit configuration and to a method for detecting an error occurring in a converter.

BACKGROUND OF THE INVENTION

Digital-to-analog converters (D/A converters) are always used when, as input signals, digital numerical values, which are stored in a storage module, for example, must be converted into a (quasi) analog voltage, as output signal. In this context, the output signal, and thus an output voltage $U_a$, is proportional to the product of a digital input signal d and a reference voltage $U_{ref}$.

$$U_a = U_{ref} \sum_{i=0}^{N-1} d_i 2^i \quad (1)$$

Accordingly, a converter, designed as an analog-to-digital converter (A/D converter), can convert an analog input voltage, as input signal, into a digital output signal.

However, in the case of D/A converters, as well as A/D converters, errors can occur during operation that should be identified in order to improve the operational reliability of such a converter.

A method for detecting errors in a plurality of A/D converters or D/A converters is described in U.S. Pat. No. 5,583,502. The method can be implemented using a circuit that has a coincidence detecting circuit, that is designed to process output signals of the converters in order to provide a conformance test signal. Moreover, the circuit has an output unit controlled by the coincidence circuit that is designed to provide a result of a test performed for the converter. Here, however, a plurality of converters are required for one test, necessitating a relatively substantial outlay for hardware.

"Test Generation and Concurrent Error Detection in Current-Mode A/D Converters" IEEE, 1995, by Wey, Chin-Long, Shoba Krishnan and Sondes Sahli, describes using an alternating logic to protect an A/D converter. In this case, current It1=Iin to be measured is first digitized; the result is stored in a register; and current It2=Iref−Iin is converted in the next step. The two thus obtained digital values are subsequently compared to one another. In the error-free case, the second value is a complement of the first value. This method is based on time redundancy, i.e., the clock cycle of the A/D converter must be greater than or equal to twice the conversion time, so that two conversions can be performed during one clock period. However, this condition cannot be met for every application.

"A Proposal for Error Tolerating Codes" IEEE, 1993 by Matsubara, Takashi and Yoshiaki Koga describes using error-tolerant codes for A/D converters. Here, window comparators are used, which supply a logical one when the analog input voltage resides within a certain range. For every bit produced by the A/D converter, a window comparator is used, the individual comparators having different voltage ranges. Thus, the outputs of the window comparators can realize an error-tolerant code. However, this method does not provide a 100% fault coverage.

SUMMARY

In accordance with the present invention, a circuit configuration and a method for detecting errors in A/D and or D/A converters integrates an analog and a digital useful signal and compares a property of the integrated useful signals.

The error detection for converters, i.e., for A/D converters and/or D/A converters, provided within the scope of the present invention, is based on the integration of the analog and the digital useful signal. In the error-free case, both integrated useful signals reach a specific threshold value in close temporal proximity. Typically, a separate threshold value is to be defined for the integrated analog useful signal, and a separate threshold value for the integrated digital useful signal. By monitoring a time window within which the integrated useful signals are supposed to reach the defined threshold values, permanent errors and drift errors in the conversion, both from analog to digital, as well as from digital to analog are recognized. The process of detecting any existing errors takes place online, i.e., during operation of the converter to be controlled, so that a conversion of a useful signal is not interrupted.

Normally, the integrated analog useful signal reaches the typically analog threshold value integrated for this, at a point in time $t_A$. The integrated digital useful signal reaches the typically digital threshold value integrated for this, at a point in time $t_D$. If both points in time $t_A$, $t_D$ are within the time window, i.e., if a time span between the two points in time $t_A$, $t_D$ is smaller than an interval length defined by the time window, then the converter to be tested is error-free; otherwise an error exists.

In the case of an A/D converter, an analog input signal is converted as an analog useful signal into a digital output signal, respectively useful signal, whereas, in the case of a D/A converter, a digital useful signal is converted, as input signal, into an analog useful signal, as output signal. In this context, a digital useful signal may include a plurality of digital numerical values, which are also referred to as digital useful signal components.

In the example method according to the present invention, both useful signals are monitored in the example embodiment. In addition, it is checked whether the useful signals meet a specific condition following one processing. To implement the example method, it is unimportant whether, at this point, the digital useful signal is the input signal to be converted and the analog useful signal is the output signal generated by the conversion, or whether the digital useful signal, as output signal, is converted from the analog useful signal, as input signal.

Regardless of the type of conversion, the analog useful signal and the digital useful signal are modified in a substantially identical manner and compared to detect an error. In accordance with one specific embodiment of the circuit configuration according to the present invention, it is merely necessary that the digital and the analog signal be transmitted to inputs provided for this purpose. In one example embodiment, it is even possible to provide a circuit configuration that is suited for examining both an A/D converter, as well as a D/A converter to check for errors.

This type of examination of a converter to check for the possible existence of an error takes place in parallel to a conversion to be performed in the particular case. Regardless of the type of conversion, the same electrotechnical modules are normally used within the circuit configuration for the analog useful signal and the digital useful signal. Since, within the framework of the described method, it is checked when both integrated useful signals reach a threshold value provided in the particular case, it is merely necessary to observe that the input signal is delayed at least once during the examination to be carried out, since the output signal is first generated from the already existing input signal. A digital useful signal may include a plurality of digital useful signal components, a digital useful signal component standing for a digit and/or a power of a number represented by the digital useful signal.

The example circuit configuration according to the present invention is designed for implementing all steps of the example method. In this context, individual steps of this method may also be performed by individual components of the circuit configuration. In addition, functions of the circuit configuration or functions of individual components of the circuit configuration may be implemented as steps of the method. Moreover, it is possible for steps of the example method to be realized as functions of at least one component of the circuit configuration or of the entire circuit configuration.

Further advantages and embodiments of the present invention are apparent from the description below and the figures.

It is understood that the aforementioned features and those explained below may be used not only in the particular stated combination, but also in other combinations or alone, without departing from the scope of the present invention.

DETAILED DESCRIPTION OF EXAMPLE EMBODIMENTS

The present invention is schematically illustrated in the figures on the basis of specific example embodiments and is described in detail below with reference to the figures.

The figures are described in an interrelated and comprehensive manner, the same reference numerals denoting functionally equivalent components.

Figure 1:
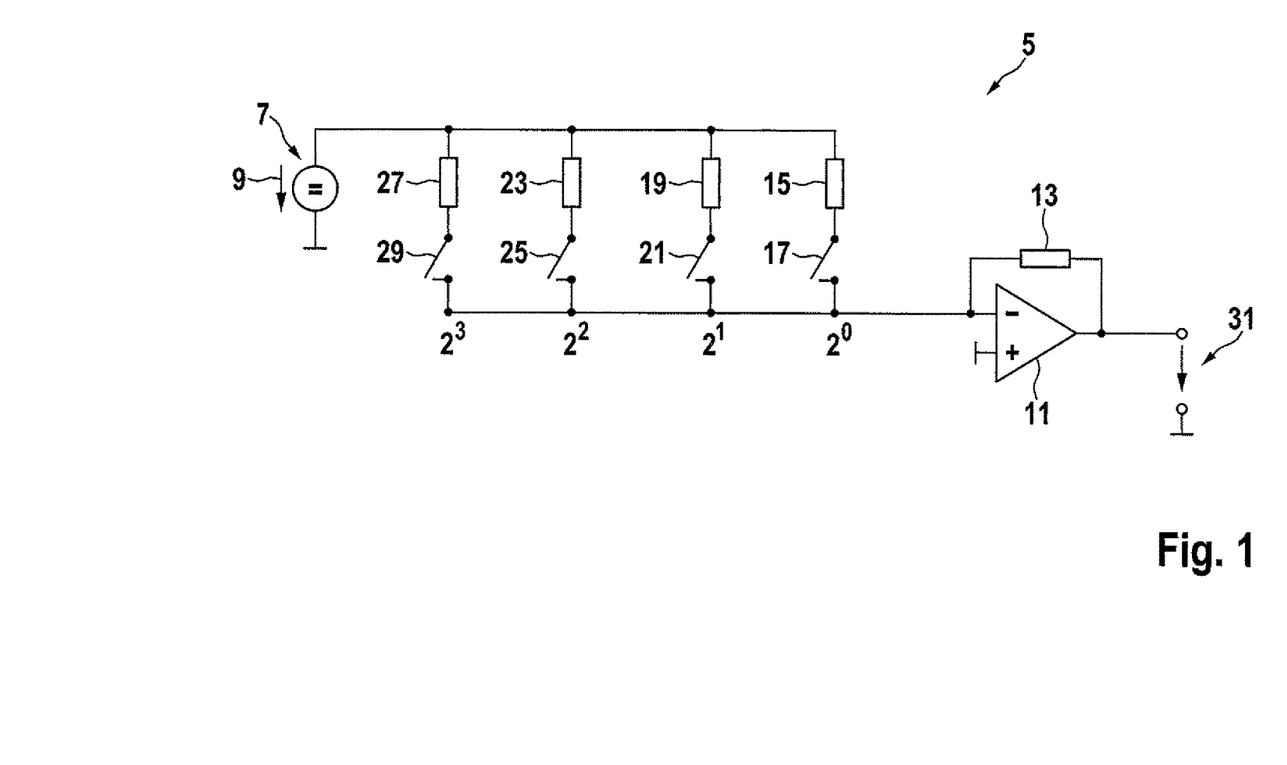
FIG. 1 shows, in a schematic representation, an example of a D/A converter for implementing a D/A conversion principle.

In a schematic representation, FIG. 1 shows an example of a converter designed as D/A converter 5, which is designed for implementing a conversion of a digital input signal, as digital useful signal, into an analog output signal, as analog useful signal. This D/A converter 5 encompasses a voltage source 7 in the form of a D/C voltage source, which is used to supply a reference voltage 9 $U_{ref}$. Moreover, D/A converter 5 includes a comparator 11, to whose negative input and output, a comparative resistor 13 having a resistance value R is connected.

In addition, converter 5 includes a zeroth resistor 15 having a resistance value of 16 R, which is serially connected to a zeroth switch 17, a first resistor 19 having a resistance value of 8 R and a first switch 21 serially connected thereto, a second resistor 23 having a second resistance value of 4 R and a second switch 25 serially connected thereto, as well as a third resistor 27 having a resistance value of 2 R and a third switch 29 serially connected thereto.

It is intended that, via zeroth resistor 15 and zeroth switch 17, D/A converter 5 shown here for digital-to-analog conversion provide a zeroth power of number $2(2^0)$ as a zeroth digital useful signal component d0; that first resistor 19 and first switch 21 provide a first digital useful signal component d1 for a first power of number 2 ($2^1$); that second resistor 23 and second switch 25 provide a second digital useful signal component d2 for a value of a second power of number 2 ($2^2$); and that third resistor 27 and third switch 29 provide a third digital useful signal component d3 for a third power of number 2 ($2^3$). As output signal, the digital useful signal to be converted encompasses the described four digital useful signal components d0, d1, d2 and d3, which are transmitted to the negative output of comparator 11 and comparative resistor 13. Overall, therefore, converter 5 provides an analog useful signal, in this case an output voltage 31 $U_A$, as analog output signal, from the digital useful signal that includes the digital useful signal components d0, d1, d2 and d3.

Accordingly, one possible principle for D/A conversion for an amplitude N=4 of the digital useful signal, which is based on the summation of weighted currents, is represented in FIG. 1.

Figure 2:
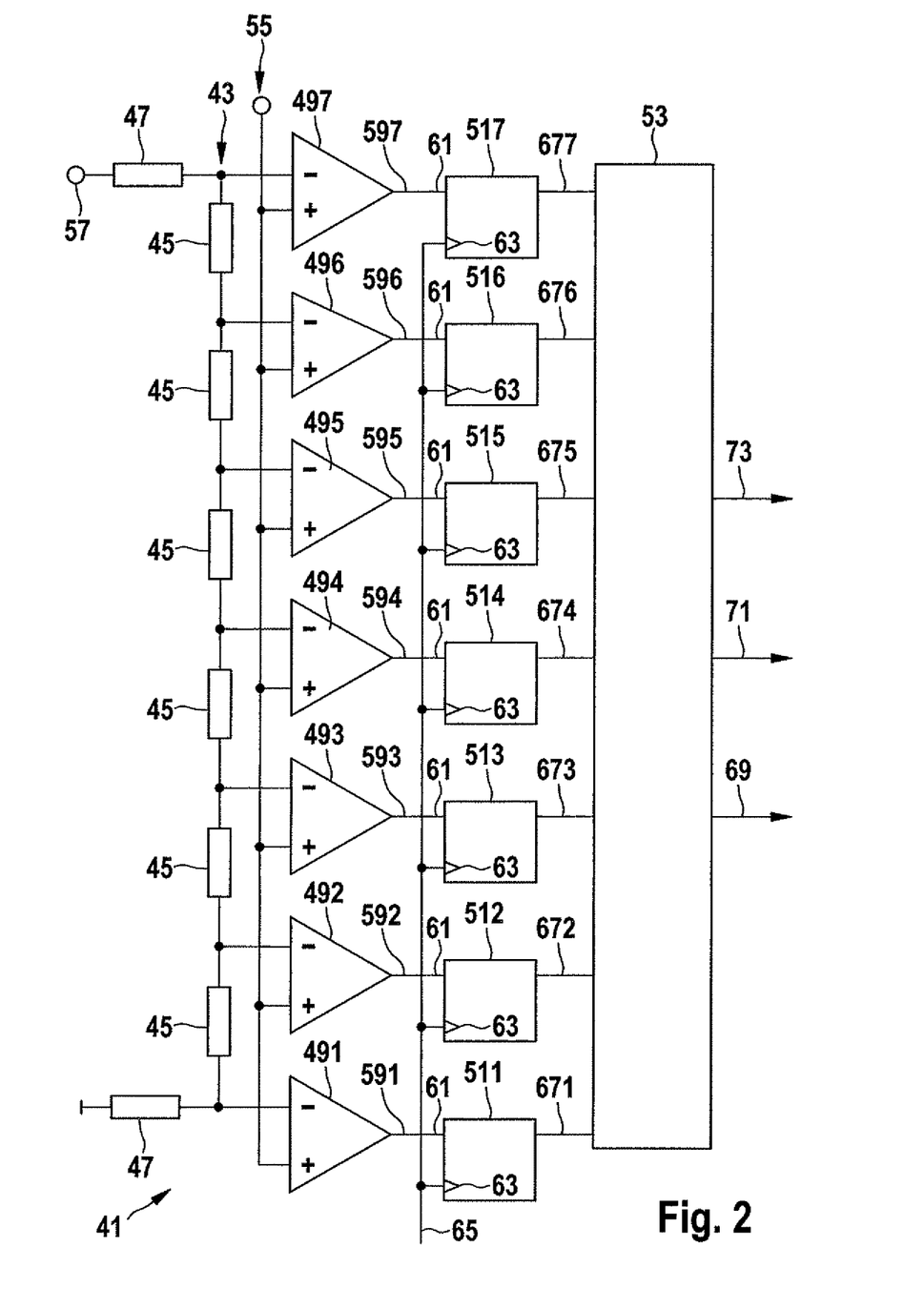
FIG. 2 shows, in a schematic representation, an example of an A/D converter.

In a schematic representation, FIG. 2 shows a specific example embodiment of a converter designed as an A/D converter 41 having a voltage divider 43, which has six serially connected first resistors 45, designed as series resistors, having resistance values R, as well as two resistors 47, designed as input resistors, which each have a resistance value R/2. In addition, converter 41 includes seven comparators 491, 492, 493, 494, 495, 496, 497, seven memory elements 511, 512, 513, 514, 515, 516, 517, and one decoder 53.

A/D converter 41 schematically illustrated in FIG. 2 is able to digitize an analog useful, as input signal, in this case, an input voltage 55 $U_{in}$, which is applied to positive inputs of comparators 491, 492, 493, 494, 495, 496, 497. In this context, a reference voltage 57 $U_{ref}$ is applied to voltage divider 43. Reference voltage 57, which is divided by resistors 45, 47, is applied to negative inputs of comparators 491, 492, 493, 494, 495, 496, 497.

Also provided is a first comparator state 591 k1 at an output of a first comparator 491, a second comparator state 592 k2 at an output of a second comparator 492, a third comparator state 593 k3 at a third comparator 493, a fourth comparator state 594 k4 at a fourth comparator 494, a fifth comparator state 595 k5 at a fifth comparator 495, a sixth comparator state 596 k6 at a sixth comparator 496, and a seventh comparator state 597 k1 at a seventh comparator 497.

These provided comparator states 591, 592, 593, 594, 595, 596, 597 are fed to first inputs 61 (1D) of memory elements 511, 512, 513, 514, 515, 516, 517. In each case, clock signal 65 CLK is transmitted to second inputs 63 (C1) of memory elements 511, 512, 513, 514, 515, 516, 517.

Moreover, transmitted to decoder 53 from an output Q of first memory element 511 is a first T-output signal 671 x1; from an output Q of second memory element 512, a second T-output signal 672 x2; from an output Q of third memory element 513, a third T-output signal 673 x3; from an output Q of fourth memory element 514, a fourth T-output signal 674 x4; from an output Q of a fifth memory element 515, a fifth T-output signal 675 x5; from an output Q of a sixth memory element 516, a sixth T-output signal 676 x6; and, from an output Q of a seventh memory element 517, a seventh output signal 677 x7. These mentioned T-output signals 671, 672, 673, 674, 675, 676, 677 x1, x2, x3, x4, x5, x6, x7 form what is generally referred to as a thermometer code within A/D converter 41.

Finally, decoder 53 provides three digital useful signal components 69, 71, 73 d1, d2, d3 as output values. In this context, a zeroth digital useful signal component 69 d0 represents a value of the zeroth power of number 2; a value of a first digital useful signal component 71 dl represents a value of a first power of number 2; and a second digital useful signal component 73 d2 represents a value of the second power of number 2.

Analog-to-digital converters, respectively A/D converters 41 are used when analog useful signals, as input signals, are converted into digital numerical values, as digital useful signals, and thus output signals. These digital numerical values may be subsequently stored and further processed. Taking into consideration the sampling and quantization effects, a digital useful signal, respectively output signal d of amplitude N is proportional to analog input voltage $U_{in}$:

$$d = \frac{U_{in}}{U_{LSB}} = \frac{d_{max}}{U_{ref}} U_{in} \quad (2)$$

where $$U_{LSB} = \frac{U_{ref}}{d_{max}} \quad (3)$$

In this case, $U_{LSB}$ is the resolution of A/D converter 41. A/D converter 41 schematically shown in FIG. 2 has an amplitude of N=3 for a binary number as a digital useful signal and is designed in accordance with the parallel conversion principle. The seven comparators 491, 492, 493, 494, 495, 496, 497 and voltage divider 48 having eight resistors 45, 47 generate what is generally referred to as the thermometer code, which includes output signals 671, 672, 673, 674, 675, 676, 677, x1, x2, x3, x4, x5, x6, x7 of memory elements 511, 512, 513, 514, 515, 516, 517, and is then converted by decoder 53 into binary number d, which includes the three digital useful signal components 69, 71, 73 d0, d1, d2, as output signals.

Table 1 shows the relationship between the input voltage, as analog input signal, comparator states 591, 592, 593, 594, 595, 596, 597 k1, k2, k3, k4, k5, k6, k7 and binary values 69, 71, 73 d0, d1, d2 for A/D converter 41 from FIG. 2. However, other converters for the A/D conversion having an alternative design are possible.

TABLE 1

Relationship between the input voltage, comparator states and the output values in the case of A/D converter 41 designed as a flash A/D converter from FIG. 2.

| Input voltage | Comparator states | | | | | | | Output value | | |
|---|---|---|---|---|---|---|---|---|---|---|
| $U_{in}$ in V | k7 | k6 | k5 | k4k | k3 | k2 | k1 | d2 | d1 | d0 |
| 0 | 0 | 0 | 0 | 0 | 0 | 0 | 0 | 0 | 0 | 0 |
| 1 | 0 | 0 | 0 | 0 | 0 | 0 | 1 | 0 | 0 | 1 |
| 2 | 0 | 0 | 0 | 0 | 0 | 1 | 1 | 0 | 1 | 0 |
| 3 | 0 | 0 | 0 | 0 | 1 | 1 | 1 | 0 | 1 | 1 |
| 4 | 0 | 0 | 0 | 1 | 1 | 1 | 1 | 1 | 0 | 0 |
| 5 | 0 | 0 | 1 | 1 | 1 | 1 | 1 | 1 | 0 | 1 |
| 6 | 0 | 1 | 1 | 1 | 1 | 1 | 1 | 1 | 1 | 0 |
| 7 | 1 | 1 | 1 | 1 | 1 | 1 | 1 | 1 | 1 | 1 |

The example method for detecting errors in the case of an A/D conversion is clarified in the following with reference to parallel A/D converter 41 from FIG. 2. In principle, however, the example method is applicable to all A/D converter types. However, the corresponding method for detecting an error in the case of a D/A conversion for the D/A converter 5 from FIG. 1 may also be implemented for other D/A converters.

Figure 3:
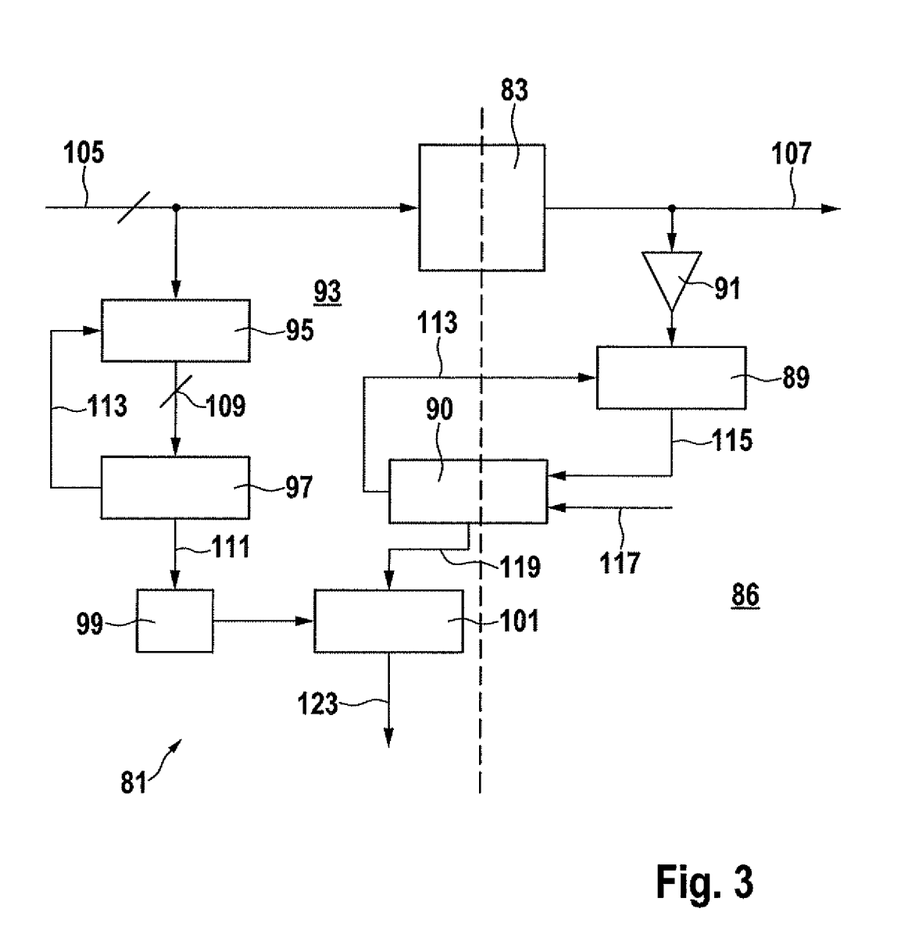
FIG. 3 shows, in a schematic representation, a first specific embodiment of a circuit configuration according to the present invention for a D/A converter.

In a schematic representation, FIG. 3 illustrates one specific example embodiment of a first circuit configuration 81 according to the present invention which is designed for detecting errors of a converter designed as a D/A converter 83. This D/A converter 83 converts a digital useful signal 105, as input signal, into an analog useful signal 107, as output signal.

Figure 4:
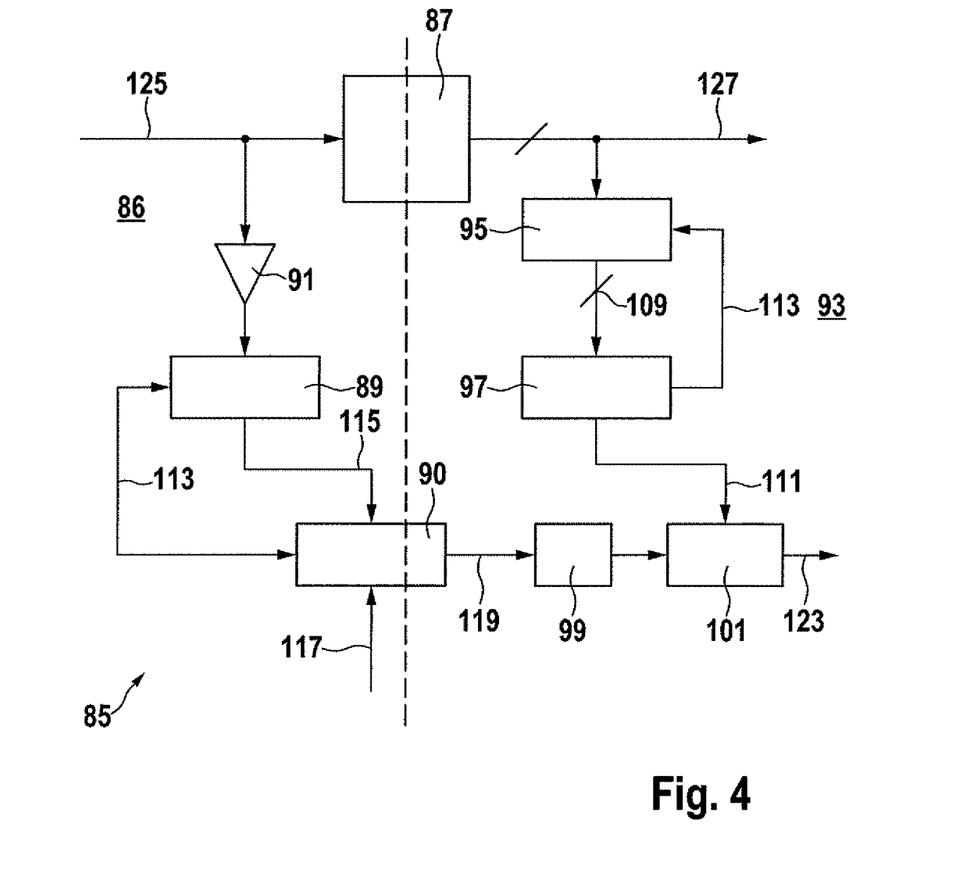
FIG. 4 shows, in a schematic representation, a second specific embodiment of a circuit configuration according to the present invention for an A/D converter.

In a schematic representation, FIG. 4 illustrates one specific embodiment of a circuit configuration 85 according to the present invention which is designed for detecting errors of a converter designed as an A/D converter 87. This D/A converter 87 converts an analog useful signal 125, as input signal, into a digital useful signal 127, as output signal.

It is provided in this case that both illustrated circuit configurations 81, 85 include at least partially identical components, namely, in each instance, on one analog side 86 of circuit configurations 81, 85, a first analog integrator module 89 having an amplifier 91 connected in incoming circuit thereto. On one digital side 93, each circuit configuration 81, 85 has a second digital integrator module 95 and a threshold-value discriminator module 97.

Configured on side 87, 93 of one of circuit configurations 81, 85 is a delay module 99 ($z^{-m}$), which modifies useful signal 105, 125, in the form of an input signal, in the context of one specific embodiment of the method according to the present invention. In the case of first circuit configuration 81 of FIG. 3, delay module 99 is configured in digital side 93, to which digital useful signal 105 is transmitted as input signal. In the case of second circuit configuration 85 of FIG. 4, delay module 99 is configured in analog side 86, to which analog useful signal 125 is transmitted as input signal.

Moreover, in each instance, a comparison module 90 is connected in outgoing circuit to each first integrator module 89. In addition, each circuit configuration 81, 85 includes an evaluation module 101. Comparison module 90, as well as evaluation module 101 are connected in outgoing circuit in each instance to both sides 86, 93 of a circuit configuration 81, 85 and, thus, functionally coordinated therewith.

The example method provided within the scope of the present invention for detecting errors, which may arise during an operation of converters and, thus, of A/D converters 41 (FIG. 2), 87 (FIG. 4) and D/A converters 5 (FIG. 1), 83 (FIG. 3), is based in each case on the integration of digital and analog useful signals 105, 107, 125, 127 and may be used both for D/A converters 5, 83 as well as for A/D converters 41, 87.

In this case, the moment when the integration result reaches a threshold value is detected on digital side 93, as well as on analog sides 86 of circuit device 81, 85. In the case of a faulty conversion, this threshold value is reached on both sides 86, 93 in close temporal proximity. The time window between reaching the threshold value on one side 86, 93 of converters 5, 41, 83, 87 and reaching the threshold value on the other side 86, 93 of converters 5, 41, 83, 87 is defined in advance. If this defined time window is exceeded, then this is indicative of the occurrence of an error during the conversion. All permanent errors in D/A and A/D converters 5, 41, 83, 87 are able to be detected in this manner.

A first specific example embodiment of the method for detecting errors in the converter designed as D/A converter 83 is described in greater detail below with reference to FIG. 3. D/A converter 83 converts digital useful signal 105 d, as input signal, into analog useful signal 107 $U_{out}$, as output signal. Digital useful signal d 105 is initially integrated in integrator module 95. It is subsequently checked in threshold-value discriminator module 97 whether a result 109 $d_{int}$ of the integration has reached a fixed threshold value or not. If the threshold value is reached, a logical one (s=1) is output as output value s 111 of threshold-value discriminator module 97; otherwise a logical zero is output (s=0). After reaching the threshold value, integrator module 95 is reset to zero by a reset 113, and a new measurement cycle is thus started.

To this end, output value s 111 of threshold-value discriminator module 97 is initially delayed by m cycles in delay module 99 $z^{-m}$. This delay is necessary in order to compensate for the delay of analog useful signal 107 $U_{out}$ provided as output signal in D/A converter 83 relative to digital useful signal 105, as input signal. In this context, in accordance with the properties of D/A converter 83, m is selected as a unit of time and may be dependent on the duration of the implemented conversion of digital useful signal 105, as input signal, into analog useful signal 107, as output signal.

A similar design is provided in FIG. 3 on analog side 86. Analog useful signal 107 $U_{out}$ is initially buffered by an amplification of one by amplifier 91 and subsequently transmitted to analog integrator module 89. The buffering is necessary since it is intended that D/A converter 83 drive the subsequent circuit stage in a constant manner, regardless of whether an error-detecting circuit configuration 81 is implemented or not. Result 115 $U_{int}$ of the integration is evaluated in comparison module 90. In this case, result 115 $U_{int}$ of the integration is compared to threshold value 117 $U_{th}$. If the result 115 $U_{int}$ of the integration is greater than threshold value 117 $U_{th}$, a logical one is output as output value c 119 of comparison block 90 (c=1). Otherwise, a logical zero is output (c=0). After reaching threshold value 117 $U_{th}$, integrator module 89 on analog side 86 is reset to zero by a reset 113, and a new measurement cycle is started.

At this point, delayed output value s 111 of threshold-value discriminator module 97 and output value c 119 of comparison module 90 are further processed digitally in evaluation module 101.

Evaluation module 101 then decides whether the change between zero and one in both output values 111, 119 has taken place within the previously defined time window. In the case that this time window is exceeded, a logical one is output at an error output 123 of evaluation module 101, and thus of circuit configuration 81 in FIG. 3. In this manner, the described error-detecting circuit configuration 81 for D/A converters 83 is able to recognize permanent errors and drift errors.

Circuit configuration 85 for detecting an error in an A/D converter is shown in FIG. 4. A/D converter 87 converts analog useful signal 125 $U_{in}$, as input signal, into digital useful signal 127 d, as output signal. When implementing the method according to the present invention, analog useful signal 125 $U_{in}$ is initially buffered by an amplification of one by amplifier 91 and is subsequently integrated in analog integrator module 89. The buffering is necessary since the analog circuit preceding A/D converter 87 is normally dimensioned in such a way that it is only able to drive A/D converter 87. Result 115 $U_{int}$ of the integration is compared in comparison module 90 to threshold value 117 $U_{th}$ for the voltage. If result 115 $U_{int}$ of the integration is greater than threshold value 117 $U_{th}$, a logical one is output as starting point 119 (c=1); otherwise a logical zero is output (c=0). After reaching threshold value 117 $U_{th}$, integrator module 89 on analog side 86 of circuit configuration 85 is reset to zero by a reset 113, and a new measurement cycle is started.

A similar design is provided on digital side 93 of circuit configuration 85 in FIG. 4. Digital useful signal 127 d is integrated in digital integrator module 95, and result 109 $d_{int}$ of the integration in threshold-value discriminator module 97 is compared to the corresponding threshold value. If result 109 $d_{int}$ of the integration reaches this threshold value, threshold-value discriminator module 97 outputs a logical one (s=1) as output value 111 s; otherwise, a logical zero is output (s=0). After reaching the threshold value, integrator module 95 is reset to zero by a reset 113, and a new measurement cycle is thus started.

As the result of comparison module 90, output value 119 c is initially delayed by m cycles in delay module 99 $z^{-m}$. This delay is necessary in order to compensate for the delay of useful signal 127, as output signal, in A/D converter 87, relative to analog useful signal 125, as input signal. Number m of the cycles may be selected in accordance with the properties of A/D converter 87.

At this point, output value 111 of threshold-value discriminator module 97 and delayed output value 119 c of comparison module 90 are further processed digitally in evaluation module 101.

Evaluation module 101 then decides whether the change between zero and one of output values 111, 119 d, s of the two useful signals 125, 127 has taken place within the previously defined time window. In the case that this time window is exceeded, a logical one is output at error output 123 of circuit configuration 85. In this manner, the described error-detecting circuit configuration 85 for detecting errors in A/D converter 87 is able to recognize permanent errors and drift errors.

FIGS. 3 and 4 show that the specific embodiments presented here of circuit configuration 81, 85 according to the present invention have a substantially identical design and differ in the schematic representation of FIGS. 3 and 4 by the location where analog side 86 and digital side 93 are depicted, which, however, is only dependent on which of useful signals 105, 107, 125, 127 is the input signal and which is the output signal of the conversion to be performed.

On each of the two sides 86, 93, one of the two useful signals 105, 107, 125, 127 is modified by integrating this useful signal 105, 107, 125, 127 and subsequently comparing a result of the integration to a threshold value. Evaluation module 101 is connected in outgoing circuit to both sides 86, 93. A distinction illustrated in FIGS. 3 and 4 between circuit configurations 81, 85 is evident merely in the configuration of delay module 99 $z^{-m}$. Delay module 99 is configured on that side 86, 93 on which useful signal 105, 125, in the form of input signal, is modified since the input signal exists already before useful signal 107, 127, in the form of output signal, that is to be converted first.

Accordingly, it is possible to provide a circuit configuration 81, 85 that is suited both for detecting errors of a converter designed as an A/D converter 87, as well as for detecting errors of a converter designed as a D/A converter 83. A circuit configuration 81, 85 of this kind may have a delay module 99 on both sides 86, 93, that is activated on that side 86, 93, to which the input signal is to be transmitted, and is deactivated on the other side 86, 93, to which the output signal is transmitted. By properly defining the time window and taking into consideration the circumstance that an output value of the input signal is provided one time interval prior to the output value of the output signal, the need for delay module 99 may possibly be eliminated.

The realization of digital threshold-value discriminator module 97 is dependent on the selected threshold value. If the threshold value is a power of two, for example, then the output of threshold-value discriminator module 97 corresponds precisely to the corresponding bit of the input signal.

Evaluation module 101 is realized as a function of the selected time window. If this time window is zero, then evaluation module 101 is composed of only one XNOR gate. In the case of a time window greater than zero, evaluation module 101 includes a counter which counts a corresponding number of cycles until an error or error signal is output. Alternatively, the evaluation of output signals 111, 119 c, s may take place in a higher-order unit, for example, a digital signal processor (DSP) or a microcontroller (μc). Typically, drift errors may be better evaluated in this manner.

In each of circuit configurations 81, 85 in FIG. 3 and FIG. 4, an error output 123 is provided, which signals an error in the conversion implemented in the particular case, i.e., of the D/A conversion or A/D conversion. This signal is either fed directly to the output of circuit configuration 81, 85, or is combined with other signals into an error flag, which is then visible at the output of the overall circuit.

Generally, different realizations and/or other types of the individual modules of circuit configurations 81, 85 illustrated in FIGS. 3 and 4 are possible.

Figure 5:
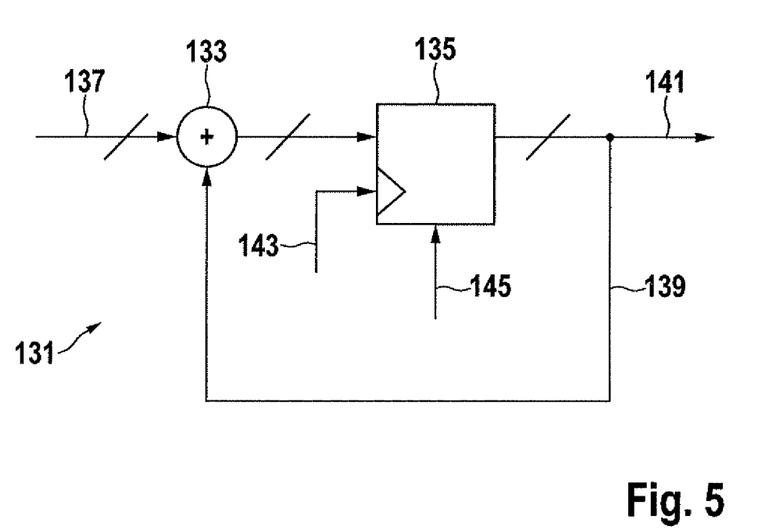
FIG. 5 shows, in a schematic representation, an example of a digital integrator block as a component of a specific embodiment of a circuit configuration according to the present invention.

In a schematic representation, FIG. 5 shows an example of a digital integrator module 131, as may be used, for example, on a digital side 93 of one of the specific embodiments presented here of circuit configurations 81, 85 according to the present invention. This digital integrator module 131 includes a summing element 133, as well as a memory element 135. A digital useful signal 137 d to be integrated is transmitted to summing element 133 and, in addition, to a first input d of memory element 135. An output signal of memory element 135 is fed to summing element 133 via a loop 139 and, as the case may be, added to digital useful signal 137. Upon completion of the integration, a result 141 $d_{int}$ of the integration is fed to another electrotechnical module, in the case of one specific embodiment of circuit configuration 81, 85 according to the present invention, to threshold-value discriminator module 97. In addition, during an integration, a clock signal 143 CLK, which is generated to control the integration, is fed to a second input of memory element 135. It is also provided that memory element 135 and, thus, also digital integrator module 131 be resettable via a reset 145, so that another, new integration may be subsequently implemented in a new measurement cycle.

Figure 6:
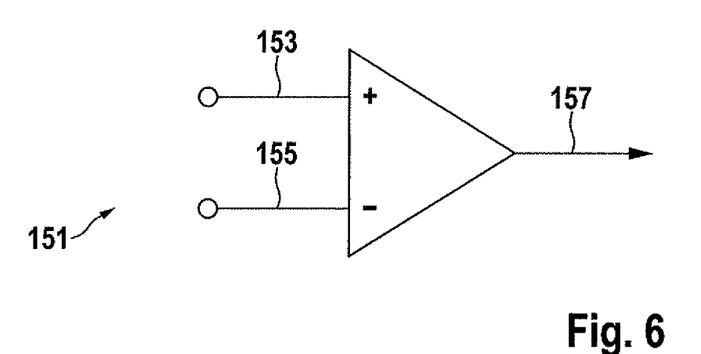
FIG. 6 shows, in a schematic representation, an example of an analog comparison block (comparator) as a component of a specific embodiment of a circuit configuration according to the present invention.

Schematically shown in FIG. 6 is a specific embodiment of an analog comparison module 151, which is also referred to as a comparator, and which may be used in one specific embodiment of a circuit configuration 81, 85 according to the present invention. Comparison module 151 includes a positive input, to which a result 153 $U_{int}$ of an integration is fed to a specific embodiment of the method according to the present invention. This result 153 of the integration is normally an integrated analog useful signal, typically a voltage. A threshold value 155 $U_{th}$, to which the integrated useful signal and thus result 153 of the integration is to be compared, is fed to a negative input of analog comparison module 151. An output value 157 c of analog comparator 151 is one, in the case that result 153 of the integration is greater than or equal to threshold value 155. If result 153 of the integration is less than threshold value 155, then output value 157 is zero.

Figure 7:
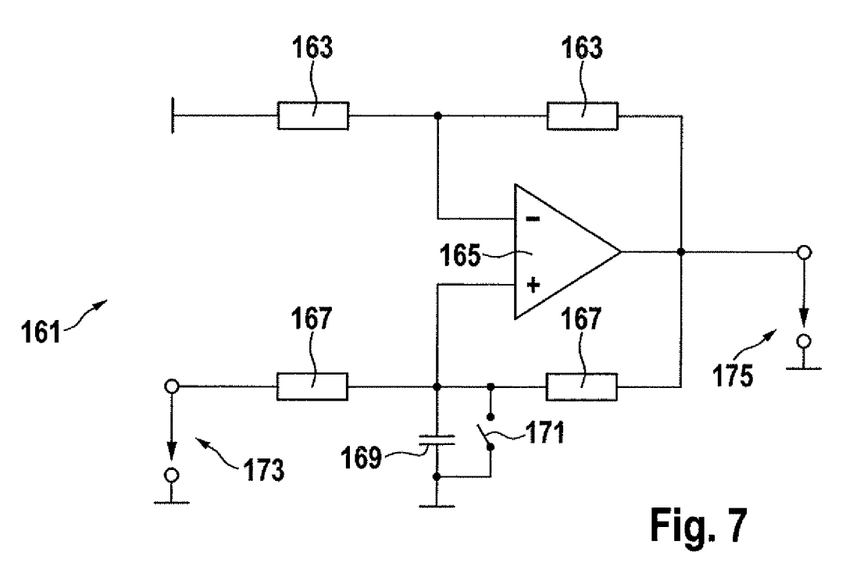
FIG. 7 shows, in a schematic representation, a first example of an analog integrator block as a component of a specific embodiment of a circuit configuration according to the present invention.

A first example of an analog integrator module, which may also be used in one specific embodiment of a circuit configuration 81, 85 according to the present invention, is schematically shown in FIG. 7. This analog integrator module 161 includes two first serially connected resistors 163 R1, a comparator 165, two second serially connected resistors 167 R2, as well as a capacitor 169 C, and a switch 171 configured in parallel to capacitor 169. An analog useful signal to be integrated is applied to an input 173 of analog integrator module 161. As an integration result, a result $U_{int}$ of the integration is present at an output 175 of integrator module 161, that, in one specific embodiment of the method according to the present invention, is fed to a comparison module 90.

Figure 8:
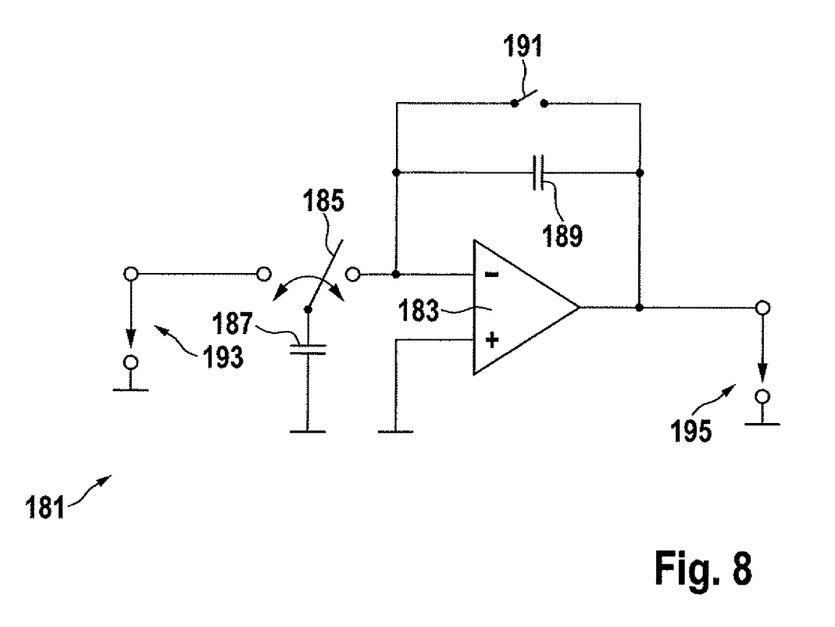
FIG. 8 shows, in a schematic representation, a second example of an analog integrator block as a component of a specific embodiment of a circuit configuration according to the present invention.

In a schematic representation, FIG. 8 shows a second example of an analog integrator module 181 that, in one specific embodiment of a circuit configuration 81, 85 according to the present invention, as shown in FIGS. 3 and 4, may be used. This analog integrator module 181 includes a comparator 183, a switch 185 that is connected to a first capacitor 187 C1, as well as a second capacitor 189 C2, which is connected in parallel to a negative input and an output of comparator 183. In addition, a second switch 191 is connected in parallel to second capacitor 189 C2. An analog useful signal to be integrated within the framework of one specific embodiment of the method according to the present invention is applied to an input 193 of analog integrator module 181. A result $U_{int}$ of the integration is present at an output 195 of analog integrator module 181.

Analog useful signal $U_0$, which may be integrated both with analog integrator module 161 from FIG. 7, as well as with analog integrator module 181 from FIG. 8, is present as electrical voltage. Depending on whether an analog integrator module 161, 181 is used in circuit configuration 81 for detecting an error in a D/A converter 83 or in the second specific embodiment of circuit configuration 85 according to the present invention for detecting an error in an A/D converter 87, in the case of the analog useful signal to be integrated, it is a question either of an output signal and thus of an output voltage $U_{out}$, in the case that analog integrator module 161, 181 in the first specific embodiment of circuit configuration 81 according to the present invention is used for a D/A converter 83, or is a question of an input signal and thus of an input voltage $U_{in}$, in the case that analog integrator module 161, 181 in the second specific embodiment of circuit configuration 85 according to the present invention in FIG. 4 is used for detecting errors of A/D converter 87.

What is claimed is:

1. A circuit configuration for detecting an error occurring in a converter, the circuit configuration configured to integrate an analog useful signal and a digital useful signal of the converter and checking in each instance when the integrated analog useful signal reaches a specific threshold value, and when the integrated digital useful signal reaches a specific threshold value, the circuit configuration configured to detect an error if the threshold value is not reached within a defined time window.

2. The circuit configuration as recited in claim 1, comprising:
an analog side to which the analog useful signal is to be transmitted, the analog side having an integrator module for implementing an integration of the analog useful signal, and a comparison module for comparing a result of the integration to the specific threshold value, the comparison module configured to provide an output value that signals whether the threshold value is reached.

3. The circuit configuration as recited in claim 2, further comprising:
an amplifier that is connected in incoming circuit to the integrator module and configured to buffer the supplied analog useful signal.

4. The circuit configuration as recited in claim 3, comprising:
a digital side, to which the digital useful signal is to be transmitted, the digital side having an integrator module for implementing an integration of the digital useful signal and a threshold-value discriminator module for comparing a result of the integration to the specific threshold value, the threshold-value discriminator module being configured to provide an output value that signals whether the specific threshold value is reached.

5. The circuit configuration as recited in claim 4, further comprising:
an evaluation module connected in outgoing circuit to both the analog side and the digital side and which receives the output values provided, the evaluation module configured to check whether the output values and thus the useful signals, from which the output values are derived, have reached the specific threshold values within the defined time window.

6. The circuit configuration as recited in claim 5, further comprising:
at least one delay module, the at least one delay module being at least one of configured and activated on the side of the circuit configuration to which a useful signal, in the form of an input signal of a converter, is to be transmitted.

7. A method for detecting an error of a converter, comprising:
integrating an analog useful signal and a digital useful signal of the converter;
checking when the integrated analog useful signal reaches a specific threshold value; and
when the integrated digital useful signal reaches a specific threshold value, recognizing an error for the converter if the threshold value is not reached within a defined time window.

8. The method as recited in claim 7, wherein the converter is an analog-to-digital converter which converts an incoming analog useful signal into an outgoing digital useful signal.

9. The method as recited in claim 7, wherein the converter is a digital-to-analog converter which converts an incoming digital useful signal into an outgoing analog useful signal.

10. The method as recited in claim 7, wherein for each useful signal, following the implementation of an integration and a comparison to the specific threshold value, an output value is provided as soon as the specific threshold value is reached, it being checked whether a time span, within which the two output values are provided, is shorter or longer than the defined time window.

11. The circuit configuration as recited in claim 1, comprising:
a digital side, to which the digital useful signal is to be transmitted, the digital side having an integrator module for implementing an integration of the digital useful signal and a threshold-value discriminator module for comparing a result of the integration to the specific threshold value, the threshold-value discriminator module being configured to provide an output value that signals whether the specific threshold value is reached.

12. The circuit configuration as recited in claim 2, comprising:
a digital side, to which the digital useful signal is to be transmitted, the digital side having an integrator module for implementing an integration of the digital useful signal and a threshold-value discriminator module for comparing a result of the integration to the specific threshold value, the threshold-value discriminator module being configured to provide an output value that signals whether the specific threshold value is reached.

13. The circuit configuration as recited in claim 3, further comprising:
an evaluation module connected in outgoing circuit to both the analog side and the digital side and which receives the output values provided, the evaluation module configured to check whether the output values and thus the useful signals, from which the output values are derived, have reached the specific threshold values within the defined time window.

14. The circuit configuration as recited in claim 2, further comprising:
at least one delay module, the at least one delay module being at least one of configured and activated on the side of the circuit configuration to which a useful signal, in the form of an input signal of a converter, is to be transmitted.

15. The circuit configuration as recited in claim 3, further comprising:
at least one delay module, the at least one delay module being at least one of configured and activated on the side of the circuit configuration to which a useful signal, in the form of an input signal of a converter, is to be transmitted.

16. The circuit configuration as recited in claim 4, further comprising:
at least one delay module, the at least one delay module being at least one of configured and activated on the side of the circuit configuration to which a useful signal, in the form of an input signal of a converter, is to be transmitted.

17. The method as recited in claim 8, wherein the converter is a digital-to-analog converter which converts an incoming digital useful signal into an outgoing analog useful signal.

18. The method as recited in claim 7, wherein for each useful signal, following the implementation of an integration and a comparison to the specific threshold value, an output value is provided as soon as the specific threshold value is reached, it being checked whether a time span, within which the two output values are provided, is shorter or longer than the defined time window.

* * * * *